United States Patent
Jin

(10) Patent No.: US 9,058,286 B2
(45) Date of Patent: Jun. 16, 2015

(54) INFINITE IMPULSE RESPONSE FILTER ARCHITECTURE WITH IDLE-TONE REDUCTION

(71) Applicant: MICROSEMI SEMICONDUCTOR ULC, Kanata (CA)

(72) Inventor: Qu Gary Jin, Kanata (CA)

(73) Assignee: Microsemi Semiconductor ULC, Kanata, ON (CA)

(*) Notice: Subject to any disclaimer, the term of this patent is extended or adjusted under 35 U.S.C. 154(b) by 318 days.

(21) Appl. No.: 13/746,573

(22) Filed: Jan. 22, 2013

(65) Prior Publication Data

US 2013/0191429 A1 Jul. 25, 2013

Related U.S. Application Data

(60) Provisional application No. 61/589,960, filed on Jan. 24, 2012.

(51) Int. Cl.
*G06F 17/10* (2006.01)
*H03H 17/02* (2006.01)
*H03H 17/04* (2006.01)

(52) U.S. Cl.
CPC ........... *G06F 17/10* (2013.01); *H03H 17/0219* (2013.01); *H03H 17/04* (2013.01)

(58) Field of Classification Search
CPC .............. H03H 17/04; H03H 17/0294; H03H 17/0461; H03H 17/02; H03H 17/0223
USPC ........................................................ 708/320
See application file for complete search history.

(56) References Cited

U.S. PATENT DOCUMENTS

| | | | | |
|---|---|---|---|---|
| 3,356,947 A | * | 12/1967 | Di Toro | 708/819 |
| 5,999,955 A | * | 12/1999 | Davis et al. | 708/320 |
| 6,442,581 B1 | | 8/2002 | Laroche | |
| 7,483,931 B2 | * | 1/2009 | Shimotoyodome | 708/320 |
| 2010/0235420 A1 | | 9/2010 | Willson | |

* cited by examiner

*Primary Examiner* — Tan V. Mai
(74) *Attorney, Agent, or Firm* — Marks & Clerk; Richard J. Mitchell

(57) ABSTRACT

A digital infinite impulse response filter has a plurality of cascaded filter elements, with each filter element defining a pole of the filter and wherein the poles lie inside a unit circle. The filter elements are configured such that the p of the last filter element is a real number. In one embodiment the poles are arranged as complex conjugate pairs. In another embodiment the real part of the output of each filter element is extracted before being passed to the next filter element. This architecture offers improved idle tone with reduced complexity.

16 Claims, 4 Drawing Sheets

INFINITE IMPULSE RESPONSE FILTER ARCHITECTURE WITH IDLE-TONE REDUCTION

CROSS REFERENCE TO RELATED APPLICATION

This invention claims the benefit under 35 USC 119 (e) of U.S. provisional application No. 61/589,960 filed Jan. 24, 2012.

FIELD OF INVENTION

This invention relates to the field of digital signal processing, and in particular to an infinite impulse response filter with reduced idle tone, and a method for reducing idle tones in infinite impulse response filters.

BACKGROUND OF THE INVENTION

There are generally two basic kinds of filter: infinite impulse response (IIR) filters and finite impulse response (FIR) filters. IIR filters have an impulse response function that is non-zero over an infinite length of time. This is in contrast to finite impulse response (FIR) filters, which have fixed-duration impulse responses. As compared with a FIR filter, an IIR filter has the advantage of requiring less filter coefficients to achieve the same filter specifications. IIR filters are widely used in sigma-delta modulation for A/D and D/A codec implementation. They are also used in many filter applications.

Due to artifacts arising in the filtering process, IIR filters are prone to annoying idle tones, which are present in the absence of an input signal. The idle tone occurs when the filter input signal disappears (goes to zero) and the filter internal memory does not go away, but remains alive with an internal feedback loop. This results in an output in the absence of an input. This output follows some pattern depending on the initial filter memory conditions, which will periodically repeat the pattern at certain frequency.

In speech and voice applications, the idle tone produces a tone-like noise during quiet time. Since the idle tone depends on the filter memory initial value before the input signal disappears, the idle tone is very unpredictable as to whether it happens or not. Even if it happens, the tone frequency and strength are also unpredictable.

A known approach to reduce the idle tone is to dither the filter memory with pseudo random noise, but this approach has the disadvantage of increasing the output noise.

The general IIR filter system function is $$H(z) = \frac{\sum b_n Z^{-n}}{1 - \sum a_n Z^{-n}}$$

where $b_k$ are the feedforward coefficients acting on the input signal and $a_k$ are the feedback coefficients acting on the past outputs $y(n)$.

A known architecture is shown in FIG. 1 (the direct form II). The idle tone is caused by the IIR memory feedback loop (the denominator in the system function $H(z)$). When the input $x(n)=0$, the feedback $$y_1(n) = \sum_{k=1} a_k y_1(n-k)$$

creates new input to the memory formed by the unit delay lines 10; as the result, the output $y(n)$ stays active without going to zero. The common method of dealing with the idle tone is to add a small pseudo random noise to memories $y_1(n-k)$ in the hope that the idle tone pattern will be broken. However, the magnitude of the random noise has to be large enough to eliminate idle tone. As a side effect, this noise increases the output noise floor in the output $y(n)$. Also, there is no analytical result to show the required random noise magnitude to completely eliminate idle tone. Large simulations are needed, which only indicate that the probability of existence of idle tone is small enough so that it may never happen.

Filter transfer functions can be described in terms of poles and zeros as explained in a number of textbooks, for example, in "Analysis and Design of Feedback Control Systems", Massachusetts Institute of Technology Department of Mechanical Engineering, the contents of which are herein incorporated by reference.

SUMMARY OF THE INVENTION

According to one aspect of the present invention there is provided a digital infinite impulse response (IIR) filter, comprising a plurality of cascaded filter elements, each filter element defining a pole of the filter and having an input and an output, and wherein the poles lie inside a unit circle; and wherein the filter elements are configured such that the output of the last filter element is a real number.

Such an IIR filter architecture can substantially reduce idle tone without adding noise to the output and can be used in sigma delta modulation, analog-to-digital (A/D) and digital-to-analog (D/A) codecs, and any application where an IIR filter is required. Embodiments of the invention may be able to reduce idle tone up to 100% without increasing output noise.

One simplified embodiment wherein the complex IIR filter poles are arranged in conjugate pairs can save computational complexity by approximately by 50%.

In another embodiment a real part extraction module is arranged between pairs of filter elements to extract the real part of the output so that the processing is only performed on real numbers.

According to another aspect of the invention there is provided a method of performing a digital infinite impulse response filtering operation on an input signal, comprising: passing the input signal through a plurality of cascaded filter elements, each filter element defining a pole of the filter and having an input and an output, and wherein the poles lie inside a unit circle; and configuring the filter elements such that the output of the last filter element is a real number.

BRIEF DESCRIPTION OF THE DRAWINGS

The invention will now be described in more detail, by way of example only, with reference to the accompanying drawings, in which.

DETAILED DESCRIPTION

Figure 1:
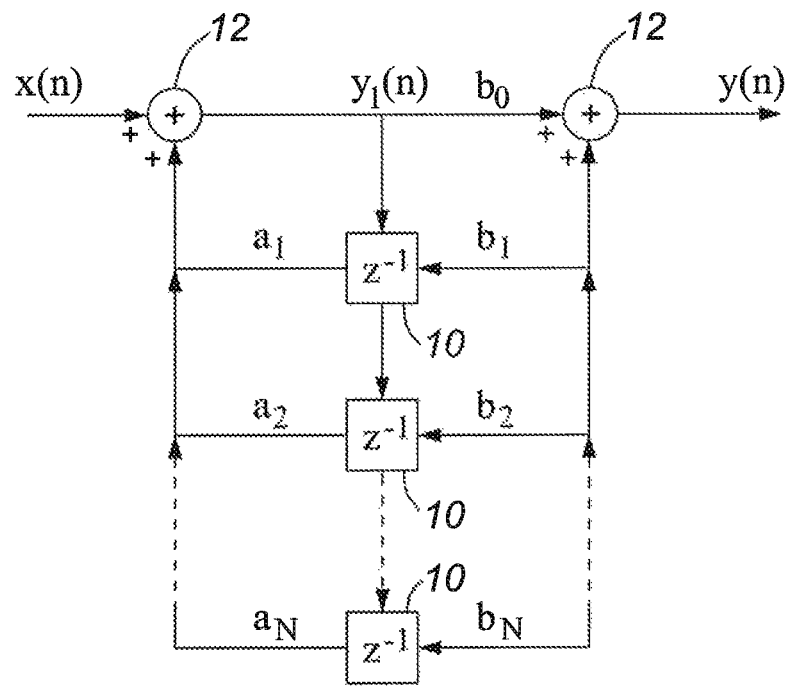
FIG. 1 is a block diagram of a direct form prior art IIR filter.

The prior art IIR filter shown in FIG. 1 includes a cascaded series of unit delay lines 10 and a pair of adders 12. $x(n)$ represents the input signal and $y(n)$ represents the output signal. $y_1(n)$ is the feedback signal.

In the IIR filter shown, an idle tone will not build up if the feedback value $y_1(n)$ is always smaller than the maximum value stored in memory when the input $x(n)$ is zero. This requires the following condition to be met:

$$\sum_{k=1} |a_k| < 1.$$

In practice, this condition is hard to meet, especially for a narrow band filter.

However, it is known that for a stable digital filter, all poles must be inside the unit circle, which means that the magnitudes of the poles are all less than one. In the equation above, the roots of the numerator represent the zeros of the filter and the roots of the denominator represent the poles of the filter.

Rewriting the system function using the pole format gives the expression $$H(z) = \frac{\sum b_n Z^{-n}}{\prod(1 - P_n Z^{-1})}$$

Figure 2:
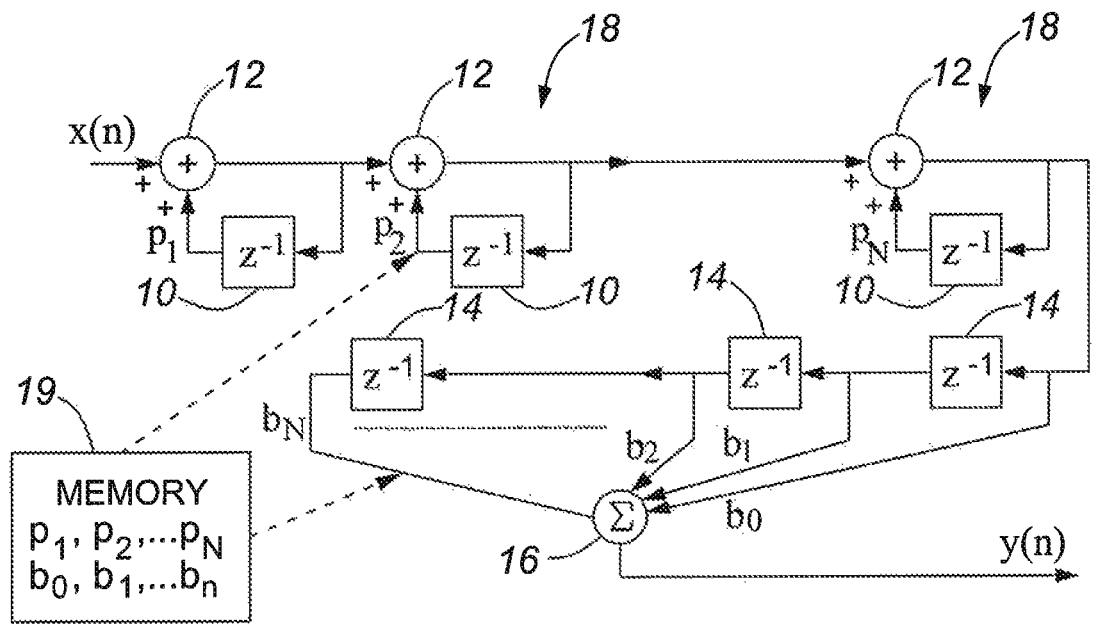
FIG. 2 is a block diagram an IIR implementation using filter poles in accordance with an embodiment of the invention.

Such an IIR filter can be implemented as shown in FIG. 2. The feedback loops shown in FIG. 2 are a cascade of several independent IIR filter elements 18, each representing a pole $p_n$ of the filter. The output of each unit delay line 10 is multiplied by the respective pole coefficient $P_n$, which is stored in a feedback memory 19.

With $|P_n|<1$, the value stored in the memory 19 will approach zero when $x(n)=0$, and consequently the idle tone will not build up. There will be no positive feedback.

The output of the ultimate filter element 18 is fed into a series of cascaded unit delay lines 14, the outputs of which are multiplied by the respective filter coefficients $b_1 \ldots b_n$, which are also stored in the memory 19, or alternatively in a separate memory. The output of the ultimate filter element 18 is additionally multiplied by the coefficient $b_0$. These respectively multiplied outputs are then summed in summer 16, the output of which is the output of the filter, $y(n)$.

In the above embodiment the cascaded filter elements 18 process the poles of the filter using the pole values $P_n$ and the cascaded unit delay lines 14 process the zeros of the filter.

The architecture shown in FIG. 2 can eliminate the idle tone without introducing jitter noise. However, while this structure provides a solution to the idle tone problem, the poles $P_1, P_2, \ldots P_n$ are complex numbers, which means that all multiplications in the feedback loop are complex multiplications. One complex multiplication is equivalent to four real number multiplications and two real number additions. Also, all the feedback memories will store complex values instead of real values. This solution thus involves considerable computational complexity.

To reduce circuit complexity for complex multiplication, embodiments of the invention make use of a property of filter poles. In general, the IIR filter has either real number poles or a pair of complex conjugate poles. For real value poles, all multiplications and related memories are real numbers and no extra effort is required for simplification.

If a pole (e.g. $P_1$) is complex number, there must be a pole which is complex conjugate of it (e.g. $P_1^*$). These two poles are advantageously paired together as shown in FIG. 3, such that the output of pair represents a real number.

Figure 3:
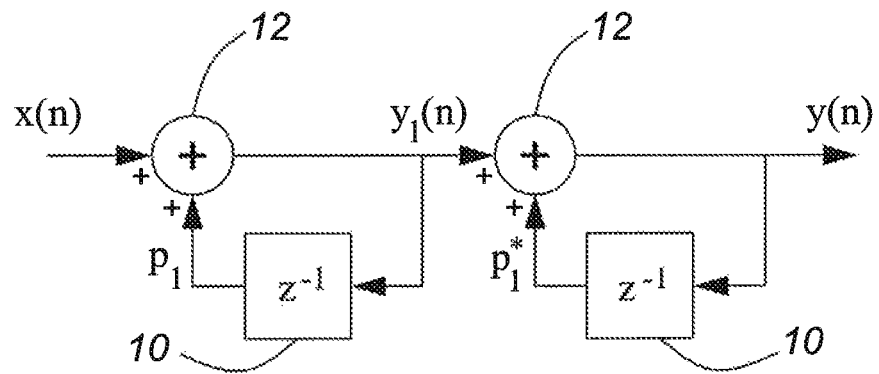
FIG. 3 shows an example of a two pole IIR filter element.

The filter output will be a real number for the two pairs of poles in FIG. 3. Therefore, the second cascade filter of the pair stores a real number in the feedback memory as although $y_1(n)$ and $P_1^*$ are complex numbers, $y(n-1)$ and $y(n)$ are real numbers. Therefore, $y(n)=y_1(n)-P_1^* y(n-1)$ is a real number, which can be simplified as $y(n)=\text{Re}[y_1(n)-p_1^* y(n-1)]=\text{Re}[y_1(n)]-p_{1r} y(n-1)$, where $p_{1r}$ represents the real part of $P_1$, i.e. $P_{1r}=\text{Re}(P_{1r})$.

Figure 4:
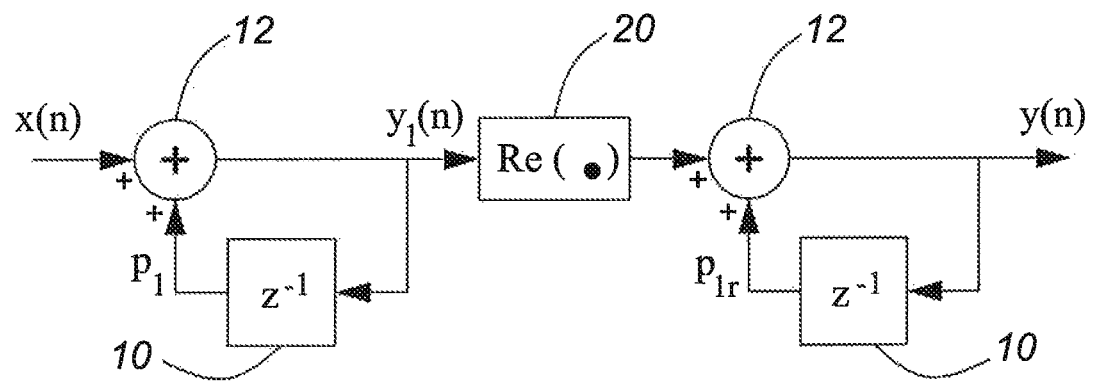
FIG. 4 shows a simplified two pole IIR filter element.

In the simplified $2^{nd}$ order IIR filter element shown in FIG. 4, only the real part of the output of the filter elements is processed. In this embodiment a real part extraction module 20 is located between adjacent filter elements to extract the real part of the output of each filter element. As a result, only the real part is passed to the next filter element. This embodiment can be implemented in software in a manner known in the art. All computations in the second cascade filter 18 are thus real number operations. The simplified two-pole architecture shown in FIG. 4 can save close to 50% in both computations (MIPS) and hardware implantation.

Example

Figure 5:
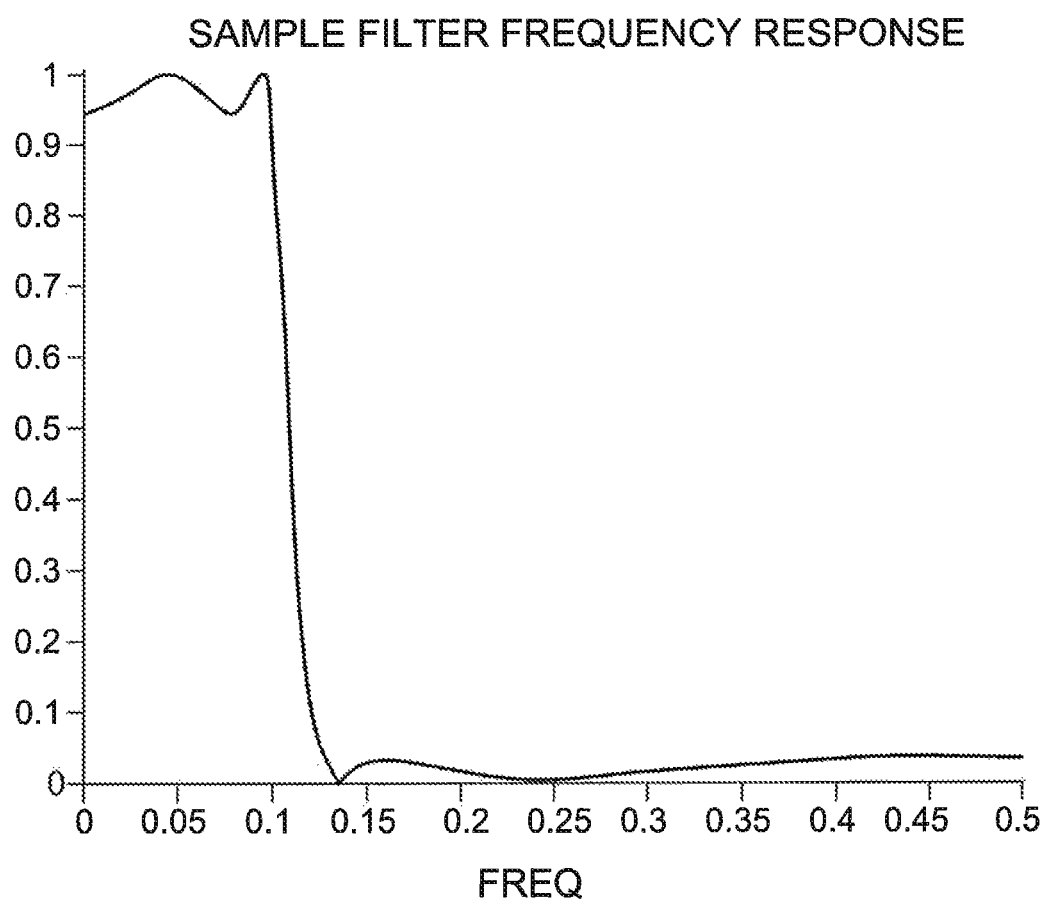
FIG. 5 shows the frequency response of an exemplary filter.

In a practical example, a low pass filter shown in FIG. 2 with the frequency response shown in FIG. 5, may have coefficients, $b_k$, $a_k$:

b0=0.0450, b1=−0.0639, b2=0.0960, b3=−0.0639, b4=0.0450 a0=1, a1=−12.8870, a2=3.5086, a3=−2.0425, a4=0.4827 with poles (of a):

p0=0.7508+0.5617i (magnitude |p0|=0.9377)

p1=0.7508−0.5617i (magnitude |p1|=−0.9377)

p2=0.6927+0.2631i (magnitude |p2|=0.7409)

p3=0.6927−0.2631i (magnitude |p3|=−0.7409)

All poles lie in a unit circle with magnitude less than 1, but the sum($|a_k|$) for k=1 to 4 is 8.9208, which is larger than 1.

Figure 6:
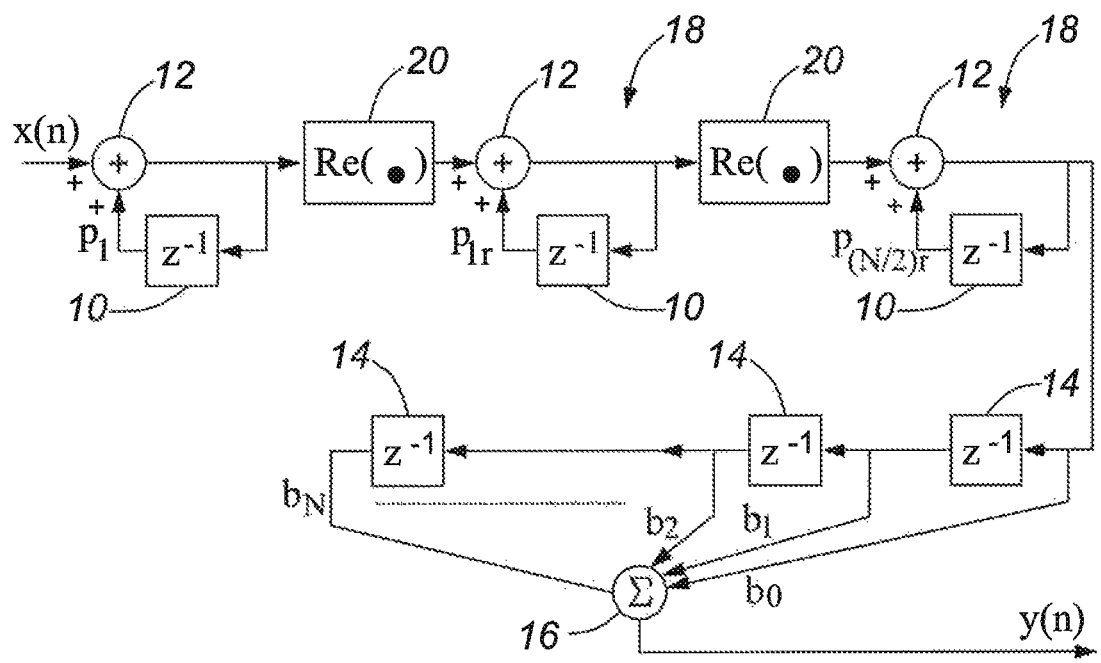
FIG. 6 is a block diagram of an IIR filter architecture for idle tone elimination in accordance with an embodiment of the invention.

This IIR filter architecture can be generalized into a cascade of several second order filters as shown in FIG. 6. This embodiment is similar to that shown in FIG. 2 except that the real part extraction module 20 is located between each pair of filter elements 18. This architecture can substantially eliminate all idle tone without introducing noise in the signal output.

Figure 7:
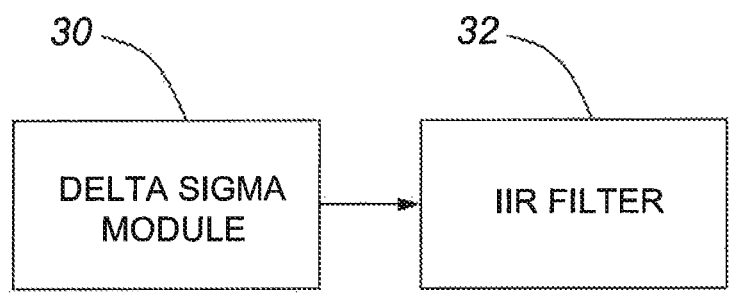
FIG. 7 is a block diagram of a sigma delta converter utilizing an exemplary IIR filter.

An IIR filter in accordance with the invention may be used in a delta sigma converter as shown in FIG. 7, which comprises a delta sigma modulator 30 followed by an IIR filter 32 in accordance with embodiments of the invention.

It should be appreciated by those skilled in the art that any block diagrams herein represent functional blocks of illustrative circuitry embodying the principles of the invention, which may in practice be implemented in software modules using digital signal processing techniques.

For example, the invention may be implemented in a processor through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included.

I claim:

1. A digital infinite impulse response filter, comprising:
a plurality of cascaded filter elements, each filter element defining a pole of the filter and having an input and an output, and wherein the poles lie inside a unit circle;
a string of cascaded delay lines downstream of the filter elements; and
a summer for summing the outputs of the delay lines to provide an output signal of the infinite impulse response filter,
wherein the filter elements are configured such that the output of the last filter element is a real number.

2. A digital infinite impulse response filter as claimed in claim 1, wherein each filter element comprises a unit delay line and an adder in a feedback configuration, and wherein the output of the unit delay line multiplied by a respective pole $P_n$ is applied as one input to the adder, another input of the adder providing an input to the filter element.

3. A digital infinite impulse response filter as claimed in claim 1, wherein the filter elements are arranged in pairs such that adjacent filter elements represent poles where one is the complex conjugate of the other.

4. A digital infinite impulse response filter as claimed in claim 1, wherein a real part extraction module is located between adjacent upstream and downstream filter elements for passing the real part of the output of an upstream filter element to the input of a downstream filter element.

5. A digital infinite impulse response filter as claimed in claim 1, wherein the cascaded delay lines are unit delay lines, and the output of each unit delay line is multiplied by a filter coefficient.

6. A digital infinite impulse response filter as claimed in claim 1, which is configured to implement the transfer function:

$$H(z) = \frac{\sum b_n Z^{-n}}{\prod (1 - P_n Z^{-1})}$$

where $b_n$ are the feedback coefficients and $P_n$ are the poles.

7. A sigma delta converter comprising:
a sigma delta modulator; and
a digital infinite impulse response filter having an output, comprising:
a plurality of cascaded filter elements, each filter element defining a pole of the filter and having an input and an output, and wherein the poles lie inside a unit circle;
a string of cascaded delay lines downstream of the filter elements; and
a summer for summing the outputs of the of the delay lines to provide an output signal of the infinite impulse response filter;
wherein the filter elements are configured such that the output of the last filter element is a real number.

8. A sigma delta converter as claimed in claim 7, wherein the filter elements are arranged in pairs such that adjacent filter elements represent poles where one is the complex conjugate of the other.

9. A sigma delta converter as claimed in claim 7, wherein each filter element comprises a unit delay line and an adder in a feedback configuration, and wherein the output of the unit delay line multiplied by a respective pole $P_n$ is applied as one input to the adder, another input of the adder provides an input to the filter element.

10. A sigma delta converter as claimed in claim 9, wherein a real part extraction module is located between adjacent upstream and downstream filter elements for passing the real part of the output of an upstream filter element to the input of a downstream filter element.

11. A sigma delta converter as claimed in claim 7, wherein the cascaded delay lines are unit delay lines, the output of each unit delay line being multiplied by a filter coefficient.

12. A sigma delta converter as claimed in claim 9, wherein the infinite impulse response filter is configured to implement the transfer function:

$$H(z) = \frac{\sum b_n Z^{-n}}{\prod (1 - P_n Z^{-1})}$$

where $b_n$ are the feedback coefficients and $P_n$ are the poles.

13. A method of performing a digital infinite impulse response filtering operation on an input signal, comprising:
passing the input signal through a plurality of cascaded filter elements, each filter element defining a pole of the filter and having an input and an output, and wherein the poles lie inside a unit circle; and
configuring the filter elements such that the output of the last filter element is a real number, and
wherein the output signal from the cascaded filter elements is passed to a string of cascaded delay lines downstream of the filter elements, and the outputs of the individual delay lines multiplied by filter coefficients are summed to provide an output signal of the infinite impulse response filter.

14. A method as claimed in claim 13, wherein each filter element comprises a unit delay line and an adder in a feedback configuration, and wherein the output of the unit delay line multiplied by a respective pole $P_n$ is applied as one input to the adder, another input of the adder providing an input to the filter element.

15. A method as claimed in claim 14, wherein the filter elements are arranged in pairs such that adjacent filter elements represent poles where one is the complex conjugate of the other.

16. A method as claimed in claim 14, wherein the real part of the output of an upstream filter element is extracted and passed as an input signal to a following downstream filter element.

* * * * *